United States Patent [19]

Ghoshal

[11] Patent Number: 5,068,628

[45] Date of Patent: Nov. 26, 1991

[54] DIGITALLY CONTROLLED TIMING RECOVERY LOOP

[75] Inventor: Sajol C. Ghoshal, Orangeville, Calif.

[73] Assignee: Level One Communications, Inc., Folsom, Calif.

[21] Appl. No.: 612,569

[22] Filed: Nov. 13, 1990

[51] Int. Cl.⁵ .............. H03K 5/26; H03L 7/087; H03L 7/091; H03L 7/093

[52] U.S. Cl. .................. 331/1 A; 307/516; 328/133; 328/155; 331/11; 331/17; 331/25; 331/27; 331/34; 331/57; 375/120

[58] Field of Search .......... 331/1 A, 11, 17, 25, 331/27, 34, 57; 307/516, 525, 526; 328/133, 134, 155; 375/120

[56] References Cited

U.S. PATENT DOCUMENTS

| | | | |
|---|---|---|---|
| 3,579,122 | 5/1971 | Paine et al. | 328/167 |
| 3,731,219 | 5/1973 | Mader et al. | 331/14 |
| 4,091,335 | 5/1978 | Giolma et al. | 331/1 A |
| 4,270,183 | 5/1981 | Robinson et al. | 364/900 |
| 4,584,695 | 4/1986 | Wong et al. | 375/81 |
| 4,975,660 | 12/1990 | Svenson | 331/27 X |

Primary Examiner—Siegfried H. Grimm
Attorney, Agent, or Firm—Merchant, Gould, Smith, Edell, Welter & Schmidt

[57] ABSTRACT

A digitally controlled timing recovery loop is comprised of a digitally controlled Phase Locked Loop (PLL) consisting of a phase detector, loop filter, and voltage controlled oscillator (VCO). The phase detector is a multi-point sampling phase comparator. The loop filter is comprised of a data independent smoothing filter and a command sequencer. The VCO is a digitally controlled ring oscillator with clock phase selection. The timing recovery loop tolerates a relatively large amount of incoming jitter and minimizes data dependent, ISI-induced, intrinsic jitter.

23 Claims, 9 Drawing Sheets

| INPUT COMMAND | OUTPUT COMMAND (INVERTED) | INCREMENT | BY 2 | DISABLE |
|---|---|---|---|---|
| UP | UP | 1 | 1 | 0 |
| DOWN | DOWN | 0 | 1 | 0 |
| UP | DOWN | X | X | 1 |
| DOWN | UP | X | X | 1 |
| UP | NO | 1 | 0 | 0 |
| DOWN | NO | 0 | 0 | 0 |
| NO | UP | 1 | 0 | 0 |
| NO | DOWN | 0 | 0 | 0 |

NOTE: 1=) HIGH  0=) LOW  X=) DON'T CARE

DIGITALLY CONTROLLED TIMING RECOVERY LOOP

BACKGROUND OF THE INVENTION

1. Field of the Invention

This invention relates in general to timing recovery loops, and in particular, to a digitally controlled timing recovery loop for long range repeaters transmitting data at 1.544 Mbps or 2.048 Mbps.

2. Description of Related Art

Long range repeaters are typically used in the transmission of data at 1.544 Mbps or 2.048 Mbps. Often, a large number of repeaters (as large as 200) are connected in tandem, so it is extremely important to minimize accumulated intrinsic jitter from each repeater. In order to minimize the accumulated jitter at the end of a chain of repeaters, the intrinsic jitter of each individual repeater must be very low.

Most long range repeaters have adaptive equalizers in their front ends to reconstruct the received signal from the transmission channel. Since the transmission medium has limited bandwidth, the signal appears distorted at the end of the channel. Distortion on a pulse causes the pulse to reduce in amplitude and spread out in time. Since one pulse smears into another, it becomes difficult to extract timing information.

The equalizer adjusts the gain and frequency response of its filter to negate the effect of the channel and bring the pulse stream back to a distortion-free state. Since the equalizer cannot remove 100% of the distortions in a pulse, residual distortion, called Inter-Symbol Interference (ISI), is left on the equalized pulse. This ISI causes the pulse to shift, and distorts both edges thereof somewhat symmetrically about the peak of the pulse.

The distortion of the pulse is a function of the type of data bits transmitted before a current bit. Typically, marks are transmitted as pulses and spaces are transmitted as no pulses. Thus, if a previous bit was a mark and its ISI affects the current bit, the current bit will move by the ISI induced by the previous bit. However, if the previous bit was a space, then the current bit is not affected. This results in data dependent, ISI-induced, intrinsic jitter.

ISI affects both edges of a pulse, by moving it in time and reducing its amplitude. If only one edge of the pulse is used to gain timing information from the data stream, then a timing recovery loop in the repeater would pass ISI-induced jitter through. This would make the intrinsic jitter too high. The major part of ISI distortion occurs in pulse shape distortion rather than in pulse position distortion.

In addition to minimizing intrinsic jitter, long range repeaters are also required to tolerate a relatively large amount of incoming jitter. This requires that the timing recovery loop in the repeater adapt its clock quickly to follow the jittered data without losing the data. This produces a design constraint inconsistent with the requirement of low intrinsic jitter.

Whatever the merits of prior timing recovery loops, they do not achieve the benefits of the present invention.

SUMMARY OF THE INVENTION

To overcome limitations in the prior art, and to overcome other limitations that will become apparent upon reading and understanding the present specification, the present invention discloses a timing recovery loop which tolerates a relatively large amount of incoming jitter and minimizes data dependent, ISI-induced, intrinsic jitter. The timing recovery loop is comprised of a digitally controlled Phase Locked Loop (PLL) consisting of a phase detector, loop filter, and voltage controlled oscillator (VCO). The phase detector is comprised of a multi-point sampling phase comparator. The loop filter is comprised of a data independent smoothing filter and a command sequencer. The VCO is comprised of a digitally controlled ring oscillator with clock phase selection.

BRIEF DESCRIPTION OF THE DRAWINGS

Referring no to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

TIMING RECOVERY LOOP

Figure 1:
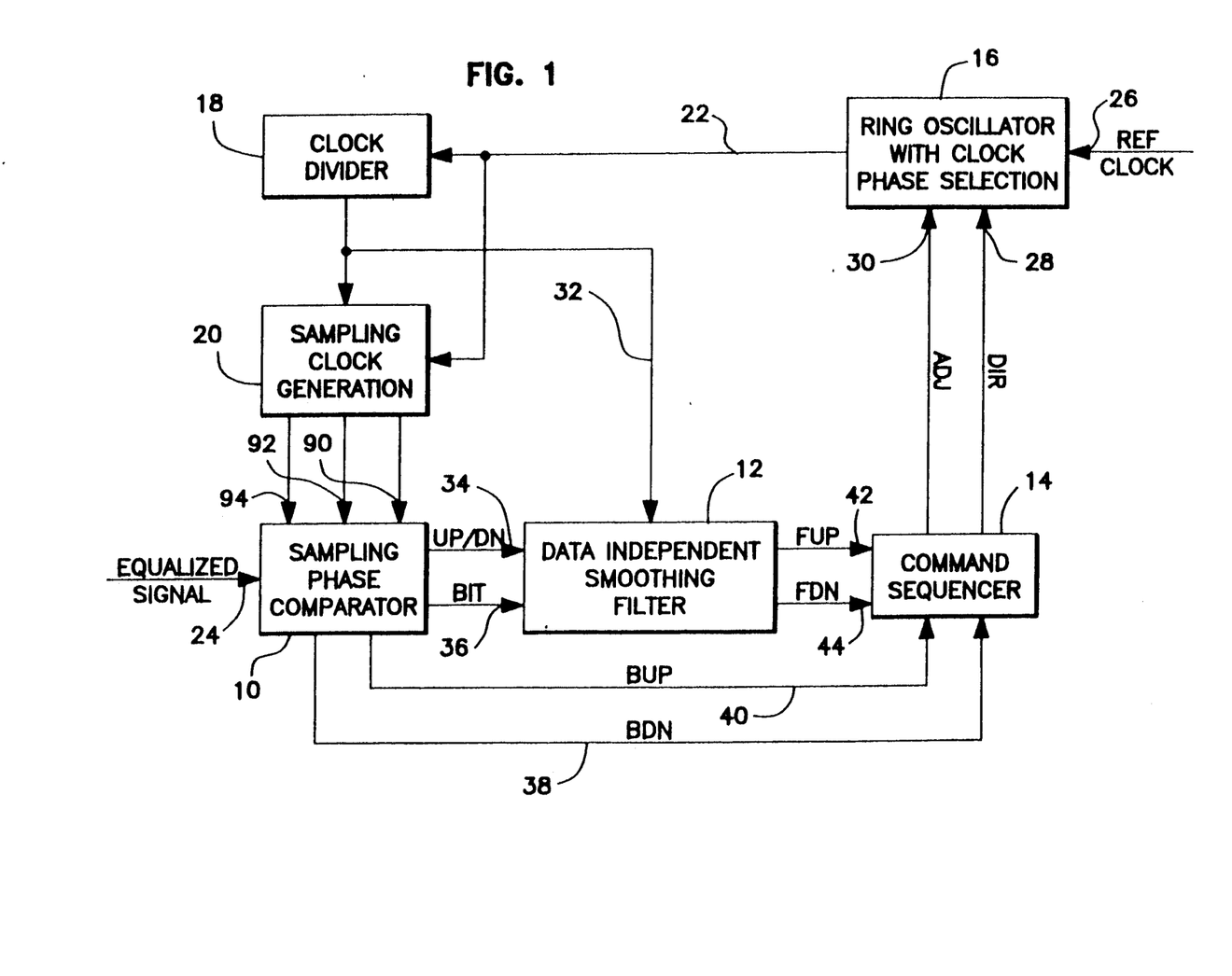
FIG. 1 is a block diagram illustrating the timing recovery loop of the present invention.

FIG. 1 is a block diagram illustrating the timing recovery loop of the present invention. The present invention is comprised of a digitally controlled Phase Locked Loop (PLL) consisting of a phase detector, loop filter, and voltage controlled oscillator (VCO). The phase detector is comprised of a multi-point sampling phase comparator 10. The loop filter is comprised of a data independent smoothing filter 12 and a command sequencer 14. The VCO is comprised of a digitally controlled ring oscillator with clock phase selection 16. Additional support blocks comprise a clock divider 18 and a sampling clock generation control 20.

RING OSCILLATOR

The digitally controlled ring oscillator 16 generates an oscillator clock signal 22 that provides accurate and robust timing control for the present invention. The frequency of the oscillator clock signal 22 is preferably much higher than an input signal, i.e., the equalized signal 24, and is locked to a reference clock 26. The reference clock 26 is preferably approximately the same frequency as the equalized signal 24 and supplied by an external source, e.g., another oscillator. The oscillator 16 accepts two inputs, the DIR signal 28 and the ADJ signal 30, to control the direction and degree of phase shift of an oscillator clock signal 22, thereby causing it to speed-up or slow-down. The clock divider 18 is used to divide down the oscillator clock signal 22 to provide an output clock 32. Data recovered from the equalized signal 24 is applied to the output clock 32 for re-transmission in a manner well known in the art.

Figure 2:
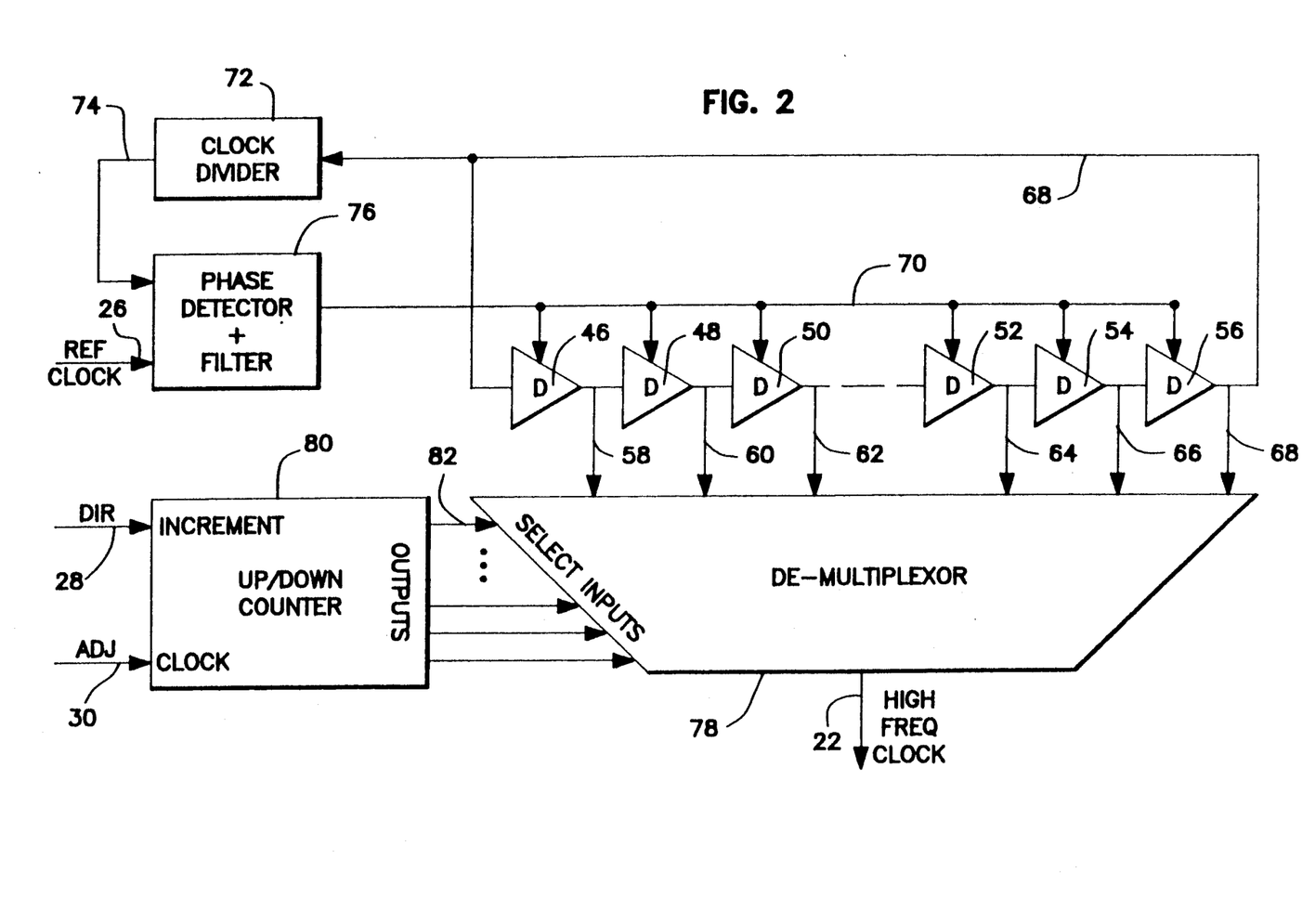
FIG. 2 is a block diagram that describes the components of the ring oscillator.
Figure 3A:
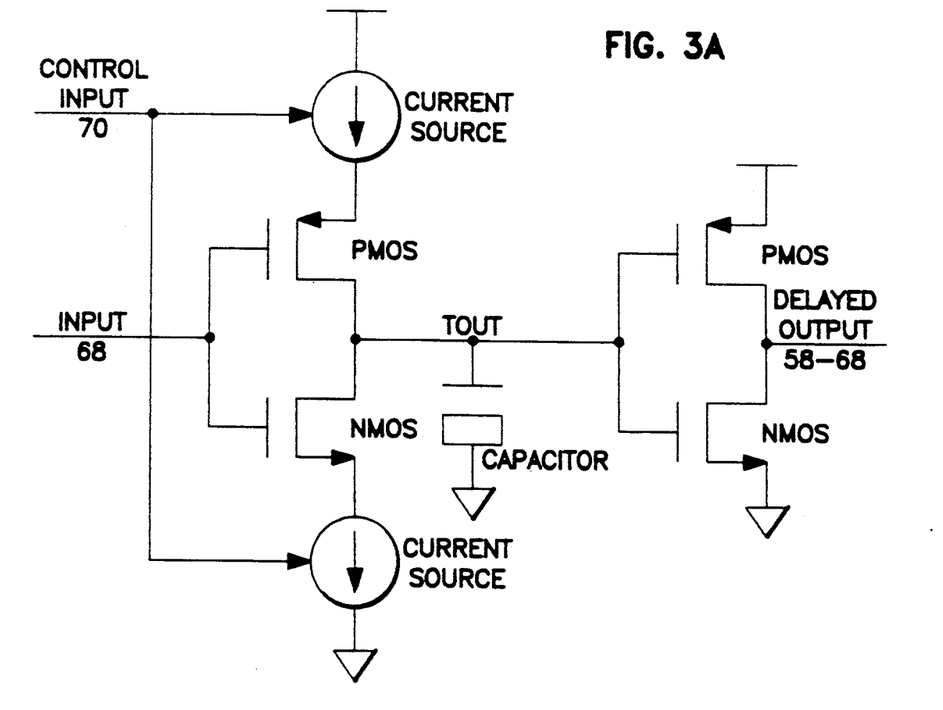
FIG. 3A is a block diagram that describes the components of a delay element in the ring oscillator.
Figure 3B:
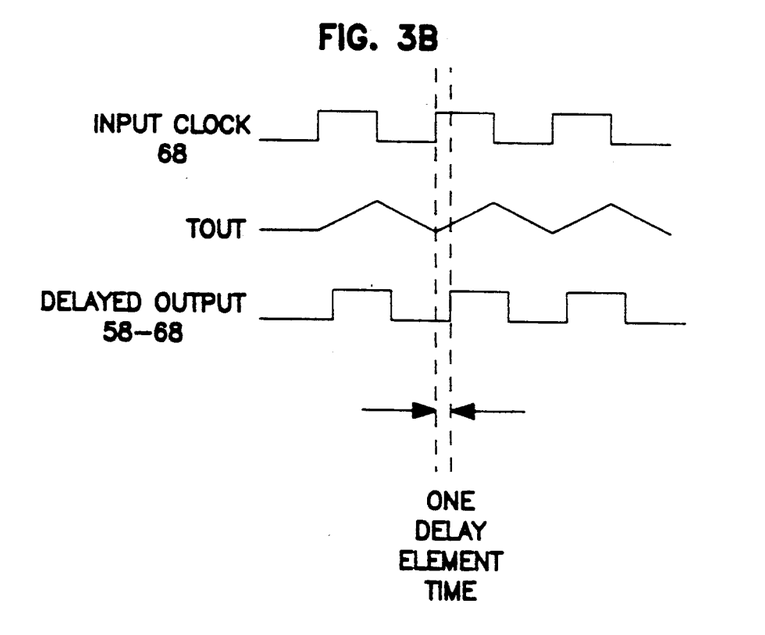
FIG. 3B is a timing diagram that illustrates the relationship between an input to a delay element in the ring oscillator and the output therefrom.

FIG. 2 is a block diagram that describes the components of the ring oscillator 16. The oscillator 16 is comprised of a chain of delay elements 46-56 having outputs 58-68, wherein the delay for each element 46-56 can be changed by a control signal 70. FIG. 3A further describes the components of a single delay element 46-56 and FIG. 3B is a timing chart describing the relationship between the input clock 68 and an output 58-68 from a delay element 46-56.

The output 68 of the last delay element 56 is fed back to the input of the first delay element 46 to maintain oscillations. The chain of delay elements 45-56 oscillates at a natural frequency determined by the individual delay of each of the delay elements 46-56. The natural frequency is preferably much higher than the frequency of the equalized signal 24.

The output 68 of the last delay element 62 is divided down by a clock divider 72 to provide a divided clock signal 74 having a frequency close to that of a reference clock 26. The divided clock signal 74 and the reference clock 26 are input into a phase detector 76. The output 70 of the phase detector 76 is the control signal 70 that adjusts the delay elements 46-56 so that the oscillator clock signal 22 is locked to the reference clock 26.

Digital control of the ring oscillator 16 is provided by a de-multiplexor 78 and an up/down counter 80. The de-multiplexor 78 selects between the outputs 58-68 of the delay elements 46-56. Each consecutive output 58-68 of the delay elements 46-56 is phase delayed from adjacent outputs by one delay element time. Selection of a particular output 58-68 as the oscillator clock signal 22 is controlled by the signals 82 output from the up/down counter 80.

The up/down counter 80 has an increment input and a clock input. The increment input is driven by the DIR signal 28 and the clock input is driven by the ADJ signal 30, both of which are generated by the command sequencer 14. If a rising edge occurs on the ADJ signal 30 when the DIR signal 28 is high, then the counter 80 increments its value and the de-multiplexor 78 selects a previous phase of the ring oscillator 16, thereby causing the oscillator clock signal 22 to speed-up. If a rising edge occurs on the ADJ signal 30 when the DIR signal 28 is low, then the counter 80 decrements its value and the de-multiplexor 78 selects a next phase of the ring oscillator 16, thereby causing the oscillator clock signal 22 to slow-down.

The natural frequency of the oscillator clock signal 22 is preferably a multiple of sixteen over the equalized signal 24, although other multiples could be used without departing from the scope of the present invention. Also, the number of delay elements 46-56 is preferably six, although more or less delay elements could be substituted therefor. Therefore, whenever a speed-up or slow-down command is given, the oscillator clock signal 22 is adjusted by 1/6th of its period and the output clock 32 is adjusted by 1/96th of its period (6*16=96). Those skilled in the art will recognize that a substituted multiple for the natural frequency and a substituted number of delay elements would provide different adjustments.

MULTI-POINT SAMPLING PHASE COMPARATOR

Referring again to FIG. 1, the multi-point sampling phase detector 10 samples and compares the amplitude of a pulse in the equalized signal 24 at a plurality of points, preferably at its peak and a quarter period o either side of the peak. The sampling phase detector 10 is driven by clock signals generated by the sampling clock generation circuit 20. The sampling clock generation circuit 20 is not described further herein, because those skilled in the art will recognize that it only requires clock signals at least four times the frequency of the equalized signal 24 and the necessary logic to select the required pulses thereof.

The sampling phase comparator 10 generates four output signals, i.e., an UP/DN signal 34, a BIT signal 36, a BDN signal 38, and a BUP signal 40. The UP/DN signal 34 indicates whether the output clock signal 32 should be sped-up and slowed-down to eliminate jitter due to pulse position distortion or frequency offset on the equalized signal 24. The BIT signal 36 indicates whether a positive or negative mark, i.e., pulse, has been received on the equalized signal 24. The BDN signal 38 indicates that a "Big Slow-Down" is required of the output clock signal 32 because a mark received on the equalized signal 24 deviates from, i.e., leads, the timing of a previously received mark by more than $\frac{1}{8}$th of a period. The BUP signal 40 indicates that a "Big Speed-Up" is required of the output clock signal 32 because a mark received on the equalized signal 24 deviates from, i.e., trails, the timing of a previously received mark by more than $\frac{1}{8}$th of a period. Those skilled in the art will recognize that any range of speed-up and slow-down signals could be generated. The UP/DN signal 34 and the BIT signal 36 are transmitted to the data independent smoothing filter 12; the BDN signal 38 and the BUP signal 40 are transmitted to the command sequencer 14.

Figure 4:
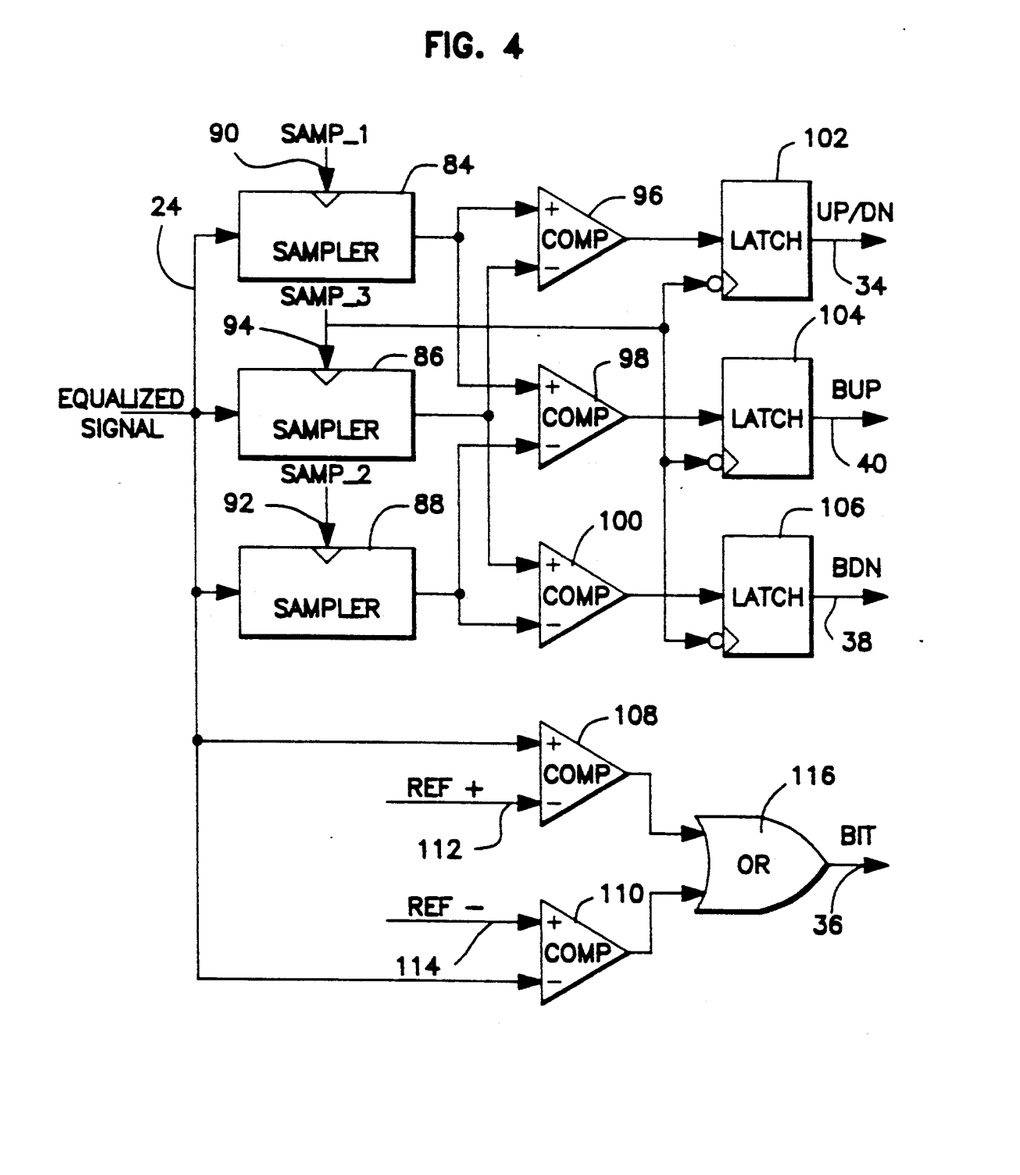
FIG. 4 is a block diagram that describes the components of the multi-point sampling phase comparator.
Figure 5:
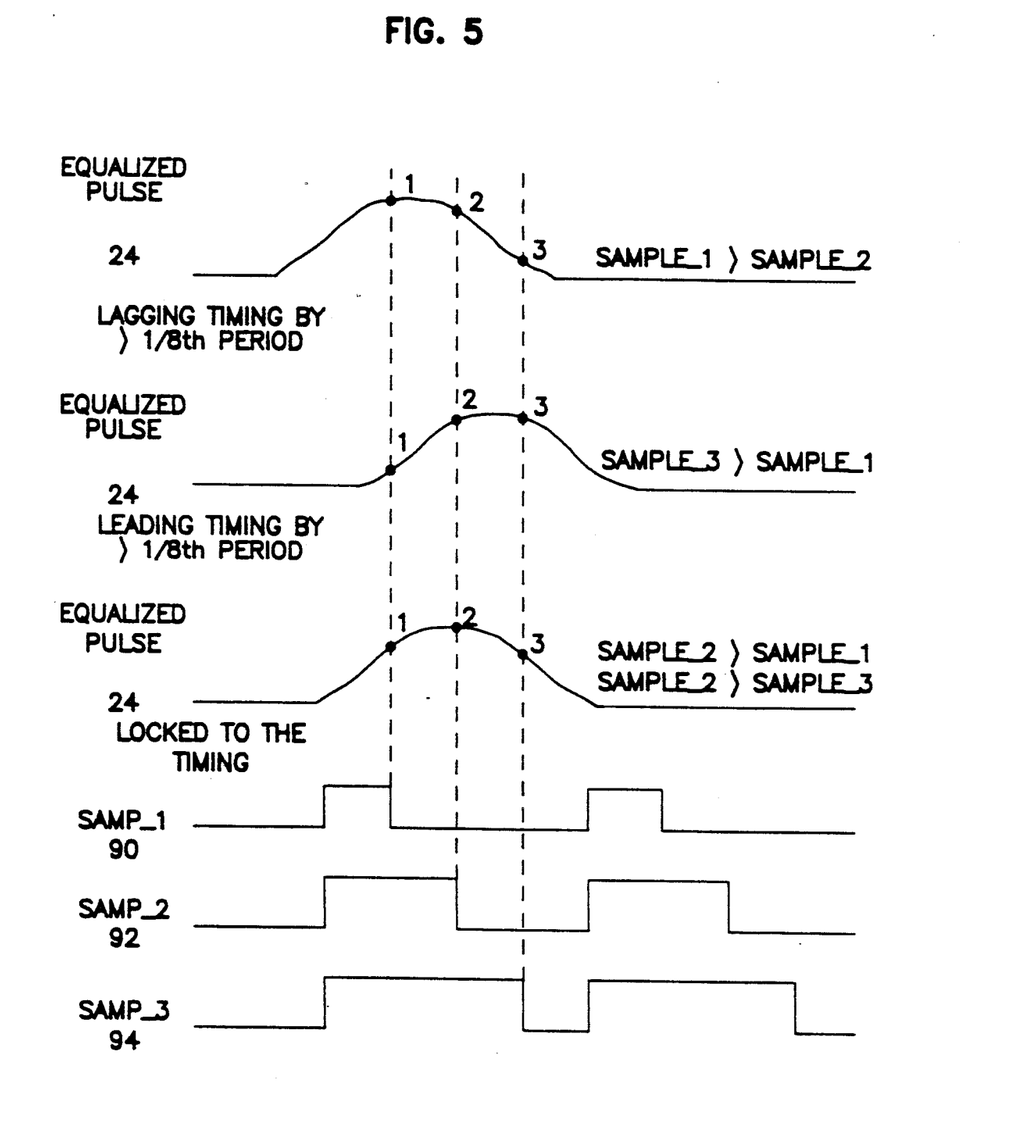
FIG. 5 is a timing diagram which illustrates the relationship of the equalized signal to the sampling clock signals used by the sampling phase comparator.

FIG. 4 is a block diagram that describes the components of the multi-point sampling phase comparator 10. Three samples of the amplitude value of the equalized signal 24 are stored into switched capacitor samplers 84-88. In the preferred embodiment, the samples are made at the peak of the equalized signal 24 and a quarter period on either side of the peak. Those skilled in the art will recognize that any number of samples may be made at any points along the pulse. Three clock signals are generated by the sampling clock generation circuit 20 to store the sampled amplitudes from the equalized signal 24, i.e., the SAMP-1 signal 90 samples a quarter of a period before the peak, the SAMP-2 signal 92 samples at the peak of the signal, and the SAMP-3 signal 94 samples a quarter of a period after the peak. FIG. 5 is a timing diagram which illustrates the relationship of the equalized signal 24 to the SAMP-1 signal 90, the SAMP-2 signal 92, and the SAMP-3 signal 94.

Three comparators 96-100 compare the sampled values stored in samplers 84-88. The outputs of the comparators 96-100 are stored into latches 102-106 on the falling edge of the SAMP-3 signal 94.

Comparator 96 compares the sample in sampler 84 and the sample in sampler 86, and stores an UP/DN signal 34 in latch 102. The UP/DN signal 34 is independent of pulse shape distortion in the equalized signal 24, provided the pulse is symmetrical about its peak. The part of the pulse not symmetrical about the peak of the equalized signal 24 contributes to the ISI induced jitter due to pulse position distortion. The UP/DN signal 34 goes high if the value of sampler 84 is greater than the value of sampler 86, which implies that the clock recovered from the equalized signal 24 is slow and needs to be sped up. If the value of sampler 84 is less than the value of sampler 86, then the clock recovered from the equalized signal 24 is fast and needs to be slowed down. The UP/DN signal 34 thus provides speed-up and slow-down controls to the timing recovery loop without affecting ISI jitter from pulse position distortion.

Comparator 98 compares the value of sampler 84 with the value of sampler 88. Comparator 100 compares the value of sampler 86 with the value of sampler 88. If there is no jitter and the equalized signal 24 is locked to the output clock 32, the outputs of comparators 98 and 100 are zero for positive marks. However, if the next mark deviates from the timing of the current mark by more than ⅛th of a period of the equalized signal 24, then the output of one of the comparators 98 or 100 goes high. If the value of sampler 84 is greater than the value of sampler 88, implying that the equalized signal 24 has slowed down by more than ⅛th of a period, a "Big Speed-Up" command, i.e., BUP signal 40, is stored in latch 104. If the value of sampler 86 is greater than the value of sampler 88, implying that the equalized signal 24 has sped up by more than ⅛th of a period, a "Big Slow-Down" command, i.e., BDN signal 38, is stored in latch 106. Those skilled in the art will recognize that other offsets could be used to the trigger the "Big Speed-Up" and "Big Slow-Down" commands.

Two other comparators 108 and 110 act as data comparators. Comparators 108 and 110 slice the equalized signal 24 at approximately 50% of its amplitude. The REF+ signal 112 is a voltage at 50% of the value of a positive mark and the REF- signal 114 is a voltage at 50% of the value of a negative mark. Thus, comparators 108 and 110 produce outputs for positive and negative marks, respectively. The outputs of the comparators 108 and 110 are ORed together at 116 to generate the BIT signal 36, which is forced high whenever a mark is received on the equalized signal 24.

DATA INDEPENDENT SMOOTHING FILTER

Referring again to FIG. 1, the data independent smoothing filter 12 controls the frequency lock between the equalized signal 24 and the output clock 32 to provide low intrinsic jitter. It also filters some of the Inter-Symbol Interference (ISI) induced jitter and reduces its effect. The filter 12 is clocked by the output clock 32 and accepts as input the UP/DN signal 34 and the BIT signal 36. If more than thirty-two UP signals 34 are received, then the filter 12 enables the FUP signal 42. If more than thirty-two DN signals 34 are received, then the filter 12 enables the FDN signal 44. Each time a FUP signal 42 or FDN signal 44 is enabled, the ring oscillator 16 makes an adjustment in the period of the output clock signal 32, which in the preferred embodiment amounts to a 1/96th change in the period of the output clock signal 32. Thus, if a stream of all marks are received on the equalized signal 24, then the output clock signal 32 is adjusted by 1/96th of its period for every 32 bits. This provides a pull range for the oscillator 16 with respect to the output clock 32 of 1/(96*32) of its period, or 10e6/(96*32) parts per million (ppm), or 325 ppm. However, when the mark density drops, as when receiving random data, to as low as 12.5% (1 mark in every 8 bits), then the pull range of the oscillator 16 with respect to the output clock 32 drops to (325/8=40 ppm), which is unacceptable. This occurs because adjustments to the output clock 32 are made only when marks are received on the equalized signal 24.

In order to solve the pull range problem during low mark density and to make the pull range relatively independent of mark density, the filter 12 observes a sliding window of 8 bits, and each speed-up command (i.e., UP signal 34) and slow-down command (i.e., DN signal 34), contributes approximately 8 times to the determination of whether to adjust the output clock signal 32. Hence, in data streams with a low density of marks, e.g., 1 mark in 8 bits, the pull range of the oscillator 16 is enhanced by 8 times, thereby bringing it back to 325 ppm. In an all marks pattern, the pull range stays at 325 ppm, because the oscillator 16 is adjusted only every 32 bits. Thus, the averaging sliding window of 8 bits makes the pull range of the oscillator 16 independent of mark density, without compromising the bandwidth or intrinsic jitter of the timing recovery loop. Further, in order to prevent locking inadvertently on repetitive 8-bit fixed patterns, the averaging sliding window may be reduced to 7 bits. This reduces the low pulse density pull range of the oscillator 16 to (7/8*325=285 ppm), which is still adequate.

Figure 6:
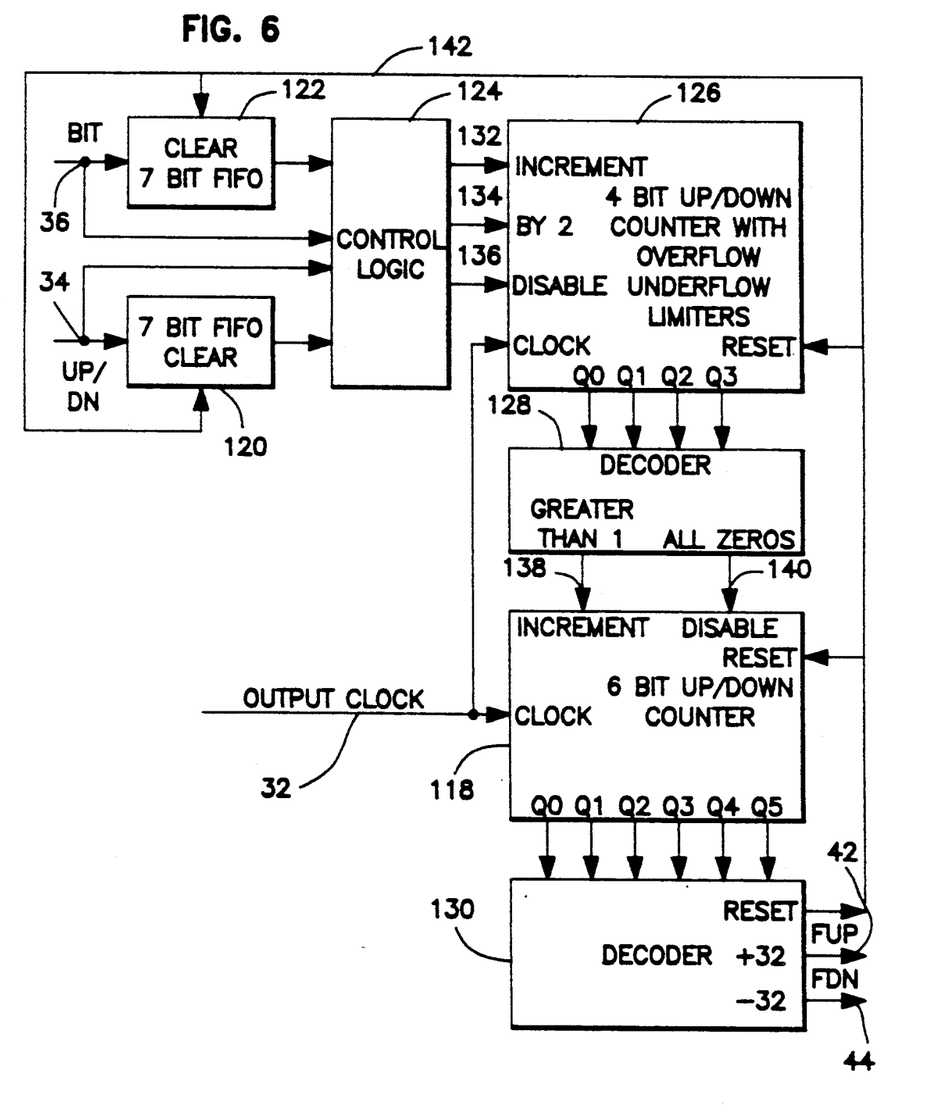
FIG. 6 is a block diagram that describes the components of the data independent smoothing filter.

FIG. 6 is a block diagram that describes the components of the data independent smoothing filter 12. The components of the filter 12 include 7-bit FIFOs 120 and 122, control logic 124, 4-bit counter 126, decoder 128, 6-bit counter 118, and decoder 130.

The UP/DN signal 34 from the sampling phase comparator 10, indicating whether the output clock signal 32 should be sped-up or slowed-down, is stored in a first 7-bit shift register or FIFO 120. The BIT signal 36 from the sampling phase comparator 10, indicating whether the bit is a mark or space, is stored in a second 7-bit shift register or FIFO 122. Each UP/DN signal 34 and BIT signal 36 is shifted through their respective FIFOs 120 and 122 until they are output after 8 clock periods. The UP/DN signal 34 and BIT signal 36 output from the 7th position of each FIFO 120 and 122, the current UP/DN signal 34, and the current BIT signal 36 are input to control logic 124.

The control logic 124 determines whether an UP or DOWN input command has occurred based on the current UP/DN signal 34 and the current BIT signal 36. The control logic 124 also determines whether an UP or DOWN output command has occurred based on the UP/DN signal 34 output from the 7th position of the FIFO 120 and the BIT signal 36 output from the 7th position of the FIFO 122. The output commands from the FIFO 120 are inverted, e.g., an UP command becomes a DOWN command and vice versa, but a NO command stays a NO command.

An UP command occurs if the UP/DN signal 34 is high and the BIT signal 36 is high. A DOWN command occurs if the UP/DN signal 34 is low and the BIT signal 36 is high. A NO command occurs if the BIT signal 36 is low, regardless of the UP/DN signal 34.

Figure 7:
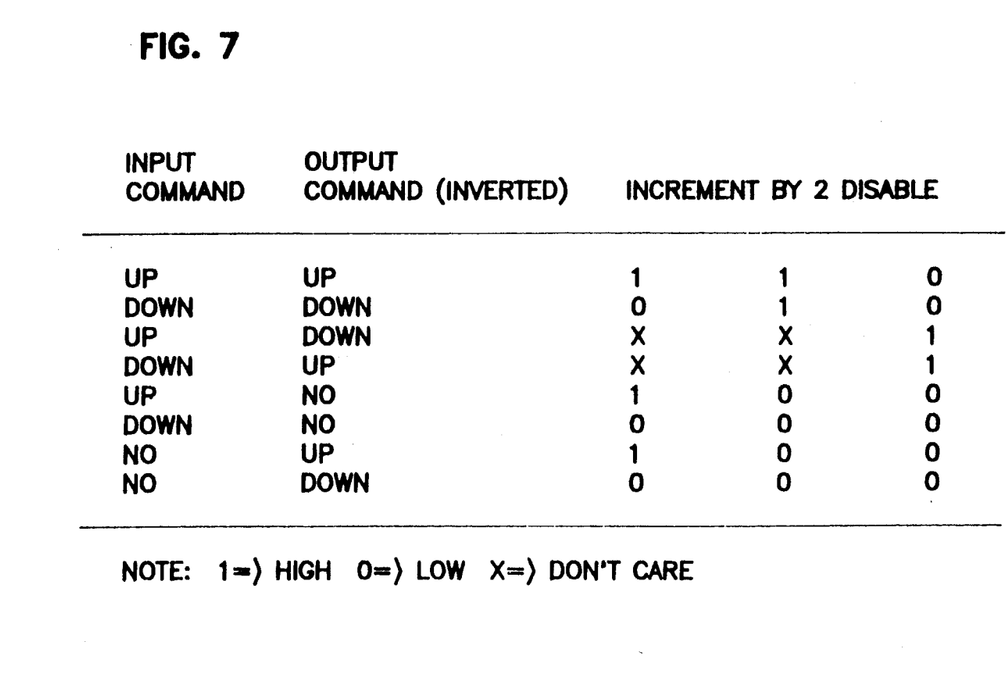
FIG. 7 is a truth table implementing the logic of control block in the data independent smoothing filter.

Based on these input and output commands of the FIFOs 120 and 122, the control logic 124 drives the three control inputs of the 4-bit up/down counter 126, i.e., Increment 132, By 2 134, and Disable 136. If the Increment input 132 is high during a pulse of the output clock 32, then the counter 126 is incremented, otherwise the counter 126 is decremented. If the By 2 input 134 is high during a pulse of the output clock 32, then the counter 126 is incremented or decremented by a value of 2. If the By 2 input 134 is low during a pulse of the output clock 32, then the counter 126 is incremented or decremented by a value of 1. If the Disable input 136 is high during a pulse of the output clock 32, then the counter 126 is preventing from incrementing or decrementing. Counter 126 also has limiting circuitry that prevents underflows and overflows, so that the counter 126 does rollover when it reaches $+/-7$. The truth table described in FIG. 7 is implemented in the control logic block 124.

Thus, an UP command input to the FIFOs 120 and 122 increments the counter 126, and after 7 bits, when the same UP command exits from the FIFOs 120 and 122, it decrements the counter 126. A DOWN command input to the FIFOs 120 and 122 decrements the counter 126, and after 7 bits, when the same DOWN command exits from the FIFOs 120 and 122, it increments the counter 126. Thus, the effect of each command is averaged in the counter 126 for 7 bits, before its effect is removed.

Decoder 128 examines the outputs from the 4-bit up/down counter 126 and drives the inputs of a 6-bit up/down counter 118, i.e., Increment 138 and Disable 140. The Increment input 138 is forced high by the decoder 128 if the 4-bit up/down counter 126 contains a value greater than 1. The Disable input 140 is forced high by the decoder 128 if the 4-bit up/down counter 126 contains a value of 0.

If the Increment input 138 is high during a pulse of the output clock 32, then the counter 118 is incremented by a value of 1, otherwise the counter 118 is decremented by a value of 1. If the Disable input 140 is high during a pulse of the output clock 32, then the counter 118 is prevented from incrementing or decrementing. Thus, the counter 118 counts the number of UP and DOWN commands.

Decoder 130 monitors the output of the 6-bit up/down counter 118. If more than thirty two UP commands occur, then the decoder 130 enables the FUP signal 42 and generates a RESET signal 142 to clear the counters 118 and 126, and the FIFOs 120 and 122. The RESET signal 142 restarts the sliding window average circuit from zero. If more than thirty two DOWN commands occur, then the decoder 130 enables the FDN signal 44 and generates the RESET signal 142. Each time the FUP signal 42 or the FDN signal 44 is enabled, the ring oscillator 16 makes an adjustment to the period of the output clock signal 32.

COMMAND SEQUENCER

Referring again to FIG. 1, the data independent smoothing filter 12 works well in reducing the intrinsic jitter, filtering the residual ISI jitter and maintaining a constant pull range for various pulse densities. However, by nature its design is a low bandwidth system, hence its jitter tolerance is poor and not particularly adequate. Therefore, a second loop is added to increase the jitter tolerance of the system by increasing the bandwidth of the timing recovery loop when it becomes necessary.

The command sequencer 14 accepts the FUP signal 42 and FDN signals 44 from the filter 12, and the BDN signal 38 and BUP signal 40 from the sampling phase comparator 10. In any speed-up operation (the BUP signal 40 or the FUP signal 42), the command sequencer 14 forces the DIR signal 28 high. In any slow-down operation (the BDN signal 38 or the FDN signal 44), the command sequencer 14 forces the DIR signal 28 low. The command sequencer 14 also pulses the ADJ signal 30 to indicate the amount of phase shift required for the output clock signal 32.

The command sequencer 14 is prioritized to allow the BDN signals 38 and BUP signals 40 to supersede the FUP signals 42 and FDN signals 44. Whenever a BDN signal 38 or BUP signal 40 occurs (implying that the equalized signal 24 and the output clock 32 are offset by more than $\frac{1}{8}$th of a period), the ring oscillator 16 is given three consecutive pulses of ADJ signals 30 in the direction indicated by the DIR signal 28 during a single period of the output clock 32. This significantly increases jitter tolerance without compromising intrinsic jitter. In contrast, whenever a FUP signal 42 or FDN signal 44 occurs (implying that the equalized signal 24 and the output clock 32 are offset), the ring oscillator 16 is given a single pulse of the ADJ signal 30 in the direction indicated by the DIR signal 28 during a single period of the output clock 32.

Figure 8:
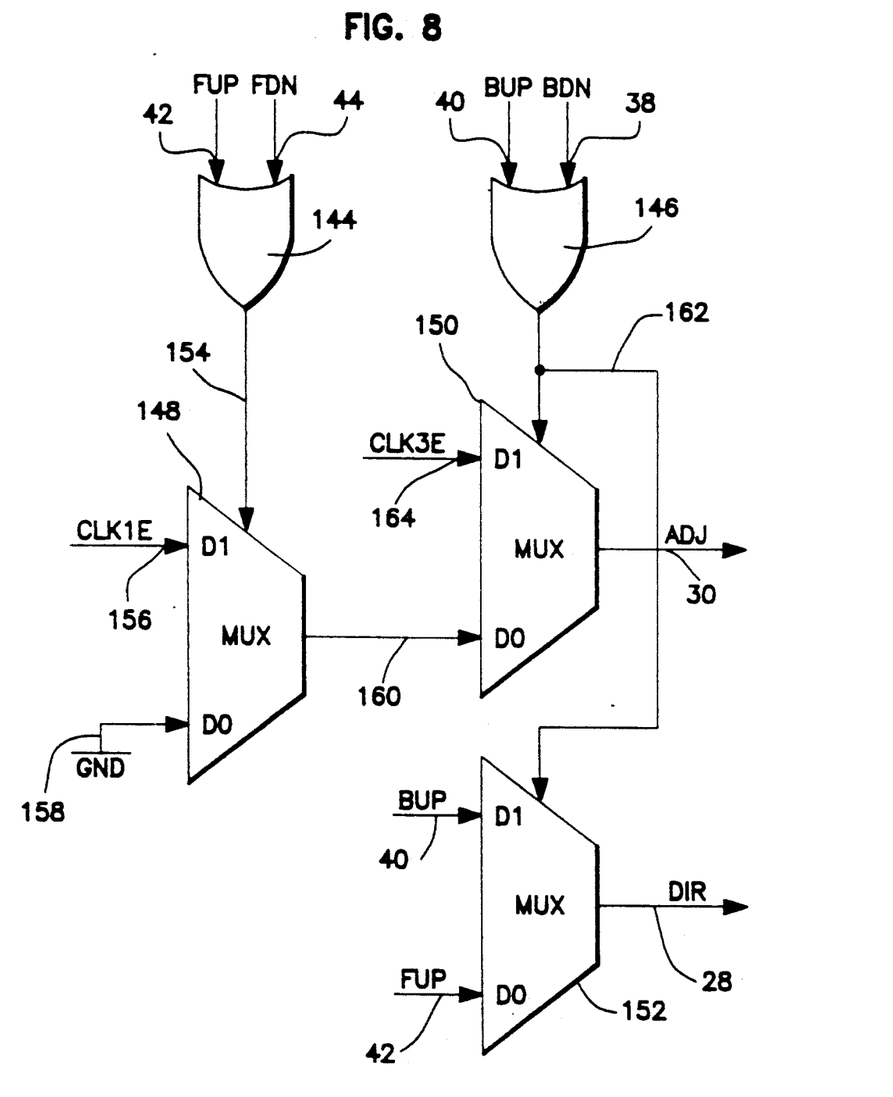
FIG. 8 is a block diagram that describes the components of the command sequencer.
Figure 9:
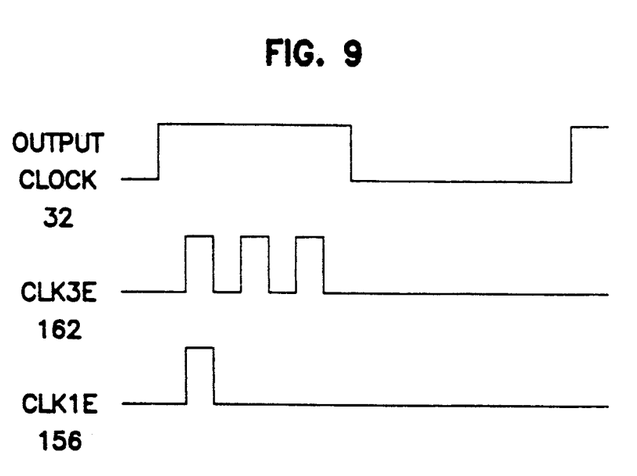
FIG. 9 is a timing diagram illustrating the actions performed by the command sequencer.

FIG. 8 is a block diagram that describes the components of the command sequencer 14. FIG. 9 is a timing diagram illustrating the pulses generated by the command sequencer 14. The command sequencer 14 is comprised of OR gates 144 and 146 and multiplexors 148-152. If either the FUP signal 42 or the FDN signal 44 is high, then the CLK1E signal 156 is selected from multiplexor 148 via OR gate 144, otherwise GND 158 is selected. If either the BUP signal 40 or the BDN signal 38 is high, then the CLK3E signal 162 is selected from multiplexor 150 via OR gate 146, otherwise the output 160 from multiplexor 148 is selected. The circuitry for generating the CLK1E signal 156 and the CLK3E signal 162 is well within the ordinary skill in the art and thus is omitted from the description. If the BUP signal 40 is high or if the FUP signal 42 is high, then the DIR signal 28 is high indicating a positive adjustment, otherwise the DIR signal 28 is low indicating a negative adjustment.

CONCLUSION

In summary, a timing recovery loop has been described which is comprised of a digitally controlled Phase Locked Loop (PLL) consisting of a phase detector, loop filter, and voltage controlled oscillator (VCO). The phase detector is a multi-point sampling phase comparator 12. The loop filter is comprised of a data independent smoothing filter 12 and a command sequencer 14. The VCO is a digitally controlled ring oscillator with clock phase selection 16. The timing recovery loop tolerates a relatively large amount of incoming jitter and minimizes data dependent, ISI-induced, intrinsic jitter.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A timing recovery loop, comprising:
   (a) oscillator means for generating an output clock;
   (b) multi-point sampling phase comparator means, connected to the oscillator means, for sampling and comparing an amplitude of a pulse in an input signal at a plurality of points along the pulse and for generating at least one control signal indicating an amount and a direction of adjustment required to lock the output clock to the input signal; and
   (c) data independent smoothing filter means, connected to both the phase comparator means and the oscillator means, for averaging the control signals indicating the amount and the direction of adjustment required to lock the output clock to the input signal, and for adjusting a frequency of the output clock by controlling the oscillator means in response to the averaged control signals so that the oscillator means, pull range is relatively independent of pulse density in the input signal.

2. The timing recovery loop of claim 1, wherein the control signals are comprised of a direction signal and a degree of phase shift signal.

3. The timing recovery loop of claim 1, wherein the phase comparator means further comprises means for sampling and comparing the amplitude of the pulse in the input signal at its peak and a quarter period on either side of the peak.

4. The timing recovery loop of claim 1, wherein the phase comparator means further comprises means for generating control signals indicating whether a pulse has been received in the input signal.

5. The timing recovery loop of claim 1, wherein the phase comparator means further comprises means for generating control signals indicating that a pulse's timing in the input signal trails a previously received pulse's timing by more than a predetermined amount.

6. The timing recovery loop of claim 1, wherein the phase comparator means further comprises means for generating control signals indicating that a pulse's timing in the input signal leads a previously received pulse's timing by more than a predetermined amount.

7. The timing recovery loop of claim 1, wherein the phase comparator means comprises:
   (1) sampling means for sampling an amplitude value of the pulse in the input signal a quarter period prior to a peak of the pulse, a quarter period after a peak of the pulse, and at the peak of the pulse; and
   (2) comparator means, connected to the sampling means, for generating an Up signal when an amplitude value sampled a quarter period prior to the peak of the pulse is greater than an amplitude value sampled a quarter period after the peak of the pulse, thereby implying that a clock recovered from the input signal is slow and needs to be sped up, and for generating a Down signal when an amplitude value sampled a quarter period prior to the peak of the pulse is less than an amplitude value sampled a quarter period after the peak of the pulse, thereby implying that a clock recovered from the input signal is fast and needs to be slowed down.

8. The timing recovery loop of claim 1, wherein the data independent smoothing filter further comprises means for preventing the timing recovery loop from locking on repetitive patterns in the input signal.

9. The timing recovery loop of claim 1, wherein the data independent smoothing filter comprises:
   (1) storage means for receiving and storing UP and DOWN commands from the phase comparator means, wherein the UP and DOWN commands are shifted through the storage means until they are output therefrom a predetermined period later; and
   (2) counter means, connected to the storage means, for averaging the effect of each received and stored UP and DOWN command for a plurality for output clock periods, and for adjusting the frequency of the output clock by controlling the oscillator means when a predetermined counter value of UP and DOWN commands is reached.

10. The timing recovery loop of claim 1, further comprising command sequencer means, connected to the multi-point sampling phase comparator means, data independent smoothing filter means, and the oscillator means, for increasing jitter tolerance in the timing recovery loop by increasing the bandwidth of the timing recover loop.

11. The timing recovery loop of claim 10, wherein the command sequencer means further comprises means for prioritizing adjustments to the frequency of the output clock, so that a larger adjustment supersedes a lesser adjustment.

12. The timing recovery loop of claim 10, wherein the command sequencer means further comprises means for adjusting the frequency of the output clock in accordance with an adjustment range indicated by the filter means and the sampling phase comparator means.

13. A phase comparator for eliminating jitter on an input signal due to pulse position distortion, comprising:
   (a) means for sampling an amplitude of a pulse in the input signal at a plurality of points along the pulse;
   (b) means, connected to the means for sampling, for comparing the sampled amplitudes; and
   (c) means, connected to the means for comparing, for adjusting a frequency of an output clock in accordance with the compared amplitudes so that the output clock is locked to the input signal.

14. The phase comparator of claim 13, further comprising means for indicating whether a pulse has been received in the input signal.

15. The phase comparator of claim 13, wherein the means for sampling further comprises means for sampling the amplitude of the pulse in the input signal at its peak and a quarter period on either side of the peak.

16. The phase comparator of claim 13, further comprising means for adjusting the frequency of the output clock when an amplitude value sampled a quarter period prior to a peak of the pulse in the input signal is greater than an amplitude value sampled a quarter period after the peak of the pulse, thereby implying that the output clock is slow.

17. The phase comparator of claim 16, further comprising means for making a large adjustment in the frequency of the output clock when a pulse's timing in the input signal trails a previously received pulse's timing by more than a predetermined amount.

18. The phase comparator of claim 13, wherein the means for adjusting comprises means for adjusting the frequency of the output clock when an amplitude value sampled a quarter period prior to a peak of the pulse is less than an amplitude value sampled a quarter period after the peak of the pulse, thereby implying that the output clock is fast.

19. The phase comparator of claim 18, further comprising means for making a large adjustment in the frequency of the output clock when a pulse's timing in the input signal leads a previously received pulse's timing by more than a predetermined amount.

20. A data independent digital filter, comprising:
   (a) means for calculating a frequency adjustment for an output clock that is relatively independent of mark density in an input signal; and
   (b) means for adjusting a frequency of the output clock by the calculated frequency adjustment so that the output clock is locked to the input signal.

21. The filter of claim 20, wherein the means for calculating further comprises sliding window means for averaging speed up and slow down commands over a plurality of periods of the output clock.

22. The filter of claim 20, wherein the means for calculating further comprises means for preventing the digital filter from locking on repetitive patterns in the input signal.

23. The filter of claim 20, wherein the means for calculating further comprises:
   (1) storage means for receiving and storing UP and DOWN commands indicating a direction for the frequency adjustment for the output clock, wherein the UP and DOWN commands are shifted through the storage means until they are output therefrom a predetermined period later; and
   (2) counter means, connected to the storage means, for averaging the effect of each received and stored UP and DOWN command for a plurality for output clock periods, and for determining the frequency adjustment for the output clock when a predetermined counter value of UP and DOWN commands is reached.

* * * * *

UNITED STATES PATENT AND TRADEMARK OFFICE
CERTIFICATE OF CORRECTION

PATENT NO.   :   5,068,628
DATED        :   November 26, 1991
INVENTOR(S)  :   Sajol C. Goshal It is certified that error appears in the above-identified patent and that said Letters Patent is hereby corrected as shown below:

Column 3, line 27, "45-56" should read --46-56--.

Column 4, line 15, "o" should read --on--.

Column 9, claim 1, line 22, "means," should read --means'--.

Column 10, claim 10, line 23, "recover" should read --recovery--.

Signed and Sealed this

Twenty-eighth Day of September, 1993

Attest:

BRUCE LEHMAN

Attesting Officer    Commissioner of Patents and Trademarks